US008050441B2

(12) United States Patent
Tan et al.

(10) Patent No.: US 8,050,441 B2
(45) Date of Patent: Nov. 1, 2011

(54) PORTABLE SPEAKERS

(75) Inventors: Jeng Khim Tan, Singapore (SG); Huang Pheng Ang, Singapore (SG); Aik Hee Goh, Singapore (SG); Susimin Suprapmo, Singapore (SG)

(73) Assignee: Creative Technology Ltd, Singapore (SG)

( * ) Notice: Subject to any disclaimer, the term of this patent is extended or adjusted under 35 U.S.C. 154(b) by 1889 days.

(21) Appl. No.: 11/144,879

(22) Filed: Jun. 3, 2005

(65) Prior Publication Data

US 2006/0274912 A1 Dec. 7, 2006

(51) Int. Cl.
*H04R 1/02* (2006.01)
*H04R 1/00* (2006.01)
*H04R 1/20* (2006.01)
*H05K 5/00* (2006.01)

(52) U.S. Cl. ........ 381/334; 381/335; 381/387; 381/336; 381/345; 381/351; 181/144; 181/145

(58) Field of Classification Search .......... 381/333–335, 381/385–388, 300, 345, 351, 182, 306; 181/144, 181/145, 199; 439/10, 11, 13, 261; 455/42, 455/344
See application file for complete search history.

(56) References Cited

U.S. PATENT DOCUMENTS

| | | | | |
|---|---|---|---|---|
| 4,139,734 | A | 2/1979 | Fincham | |
| 4,441,577 | A | 4/1984 | Kurihara | |
| 4,932,060 | A | 6/1990 | Screiber | |
| 5,349,575 | A * | 9/1994 | Park | 369/1 |
| 6,392,871 | B1 * | 5/2002 | Yanase | 361/679.07 |
| 7,095,867 | B2 * | 8/2006 | Schul et al. | 381/334 |
| 2005/0248911 | A1 | 11/2005 | Suprapmo | |

OTHER PUBLICATIONS

U.S. Appl. No. 10/907,468, Goh
Operating Instructions, "Sony SRS-T77 Active Speaker System" © 2000.
Operating Instructions, "Sony SRS-T57 Active Speaker System" © 2004.

* cited by examiner

*Primary Examiner* — Devona Faulk

(57) ABSTRACT

A portable speaker having at least one driver mounted in a first enclosure and a second enclosure separate from the first enclosure and having pivotally mounted to it the first enclosure. The second enclosure has all electronics, controls and a battery compartment. The first enclosure is moveable relative to the second enclosure between a first configuration and a second configuration, the at least one driver being protected by the second enclosure when the first enclosure is in the first configuration.

15 Claims, 8 Drawing Sheets

PORTABLE SPEAKERS

FIELD OF THE INVENTION

This invention relates to portable speakers and refers particularly though not exclusively, to portable speakers having reduced vibration-induced distortion when in use.

BACKGROUND OF THE INVENTION

Portable speakers are often used with portable electronic devices such as for example, CD players, MP3 players, laptop or notebook computers, and PDAs. To be portable they are normal compact. Being compact, there is minimal separation of the electronics, and the drivers of the speakers. Vibration caused by the drivers can induce distortion into the sound to affect quality by causing vibration of the electronic circuitry and components built-in to the portable speakers. Such induced distortion is sometimes called a microphonic effect. Due to size constrains, this problem is not addressed in compact, portable speakers.

Furthermore, the vibration of the drivers can also induce sympathetic vibration in mechanical components of the portable speakers such as, for example, battery spring terminals. Such sympathetic vibrations may be audible to a user.

Also the drivers of speakers are prone to damage and must be protected when not in used. This often entails used of a grille, or other obstruction in front of the drivers, thereby affecting sound quality.

SUMMARY OF THE INVENTION

In accordance with a first preferred aspect there is provided a portable speaker comprising at least one driver mounted in a first enclosure and a second enclosure separate from the first enclosure and having pivotally mounted to it the first enclosure. The second enclosure has all electronics, controls and a source for power.

The first enclosure may be moveable relative to the second enclosure between a first configuration and a second configuration. When the first enclosure is in the first configuration, the at least one driver may be protected by the second enclosure.

According to a second aspect there is provided a portable speaker having at least one driver mounted in a first enclosure and a second enclosure separate from the first enclosure and having pivotally mounted to it the first enclosure. The first enclosure is moveable relative to the second enclosure between a first configuration and a second configuration. When the first enclosure is in the first configuration, the at least one driver is protected by the second enclosure.

The second enclosure may have all electronics, controls and a source for power.

For both aspects, the first enclosure may have a first surface in which the at least one driver is mounted, and the second enclosure may have an upper surface. The first enclosure may be pivotally moveable relative to second enclosure such that the first surface overlays the upper surface for protecting the at least one driver when the portable speaker is not in use. The pivotal movement may be about a pivotal connection between the first surface and the upper surface; or about at least one pivot pin operatively connecting ends of the first enclosure with extended sides of the second enclosure. The upper surface may be concave along its length.

According to a third preferred aspect there is provided a portable speaker having at least one driver mounted in a first enclosure and a second enclosure separate from the first enclosure and having pivotally mounted to it the first enclosure. The second enclosure has all electronics, controls and a source for power. The first enclosure has a first surface in which the at least one driver is mounted, and the second enclosure has an upper surface, the first enclosure being pivotally moveable relative to second enclosure such that the first surface overlays the upper surface for protecting the at least one driver when the portable speaker is not in use.

The pivotal movement may be about a pivotal connection between the first surface and the upper surface; or about at least one pivot pin operatively connecting ends of the first enclosure with extended sides of the second enclosure. The upper surface may be concave along its length.

All three aspects may include a connector operatively connected to the second enclosure for movement relative thereto between a first position and a second position. The connector may have a connection for operative connection with a player when the connector is in the second position. The movement of the connector may be pivoting or sliding. The connector may have a surface that is substantially flush with a front surface of the second enclosure when the connector is in the first position.

BRIEF DESCRIPTION OF THE DRAWINGS

In order that the present invention may be fully understood and readily put into practical effect, there shall now be described by way of non-limitative example only preferred embodiments of the present invention, the description being with reference to the accompanying illustrative drawings.

In the drawings.

DETAILED DESCRIPTION OF THE PREFERRED EMBODIMENTS

Figure 1:
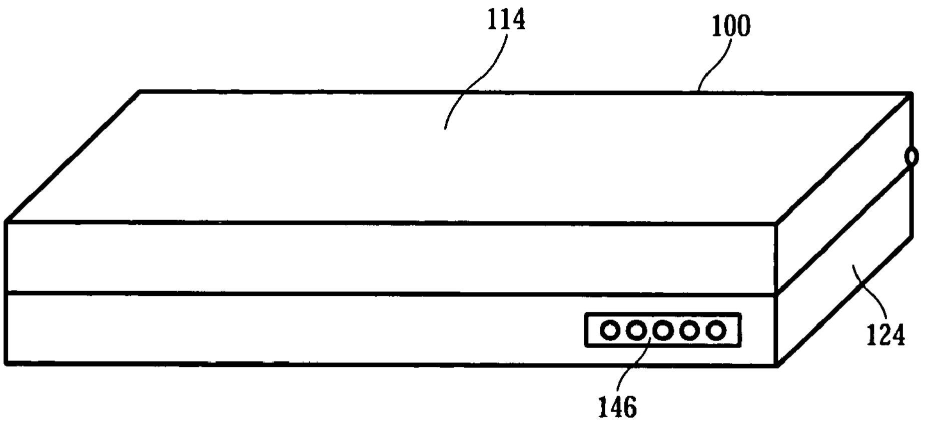
FIG. 1 is a front perspective vice of a first embodiment in a first configuration.

Throughout all drawings like reference numerals are used for like components with a prefix number being the embodiment number.

Figure 2:
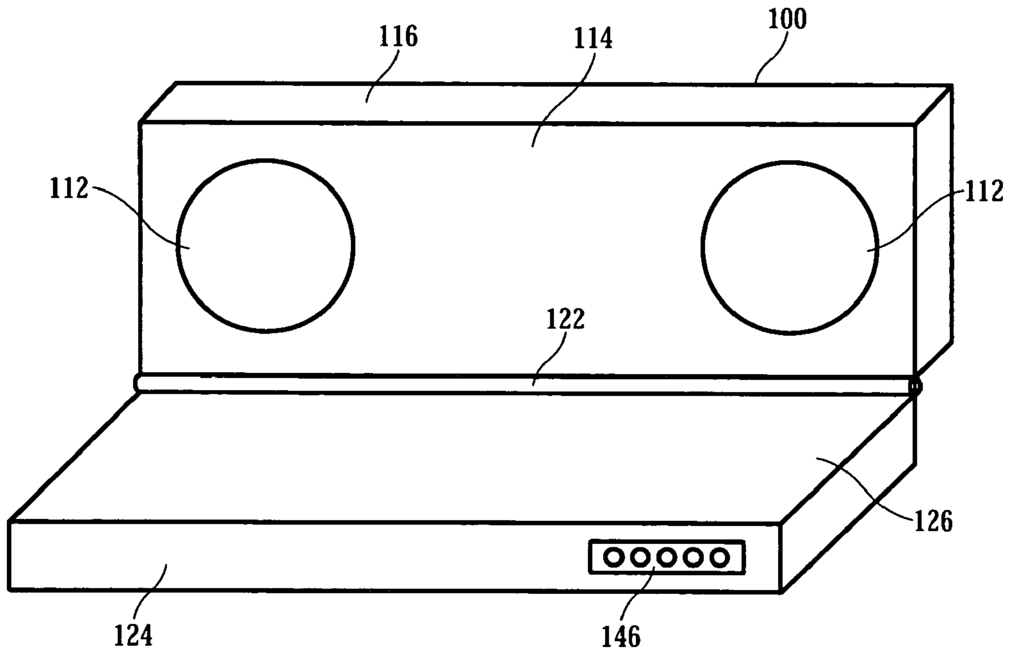
FIG. 2 is a view corresponding to FIG. 1 in a second configuration.

To first refer to FIGS. 1 and 2 there is shown a first embodiment of portable speakers 100. In FIG. 1 it is in a first configuration—a closed or not-in-use configuration. In FIG. 2 it is in the second configuration—are open or in-use configuration.

The portable speakers 100 comprise at least one loud speaker or driver 112 (hereinafter "driver"). There may be any required number of drivers 112. In this case there are two drivers. The drivers 112 are preferably spaced apart to provide a stereophonic effect, and are mounted in or to a first surface 116 of a first or driver enclosure 114. Advantageously, the drivers 112 are mounted to first surface 116 such that they are either flush with surface 116 or are recessed into surface 116. They should not project outwardly beyond surface 116. Surface 116 may be planar and flat.

The first enclosure 114 is separate from but pivotally mounted to a second or electronics enclosure 124 by means of one or more hinges 122. The separation includes acoustic separation. All electronic components including but not limited to:

(a) a source for power such as a battery compartment for the required battery or batteries/capacitors and/or a connection for mains power, (b) a connection for operative connection to an audio source, and (c) controls 146 for the portable speakers 100, are mounted in or to second enclosure 124. The controls 146 may control only functions of the speakers 100, or may also include controls for the audio source.

The second enclosure 124 has an upper surface 126 that is preferably the same size and shape as first surface 116, and also may be planar and flat. In this way the first enclosure 114 can be pivoted about hinges 122 until first surface 116 overlays and is immediately adjacent to or contacts upper surface 126 thereby enabling the second enclosure 124 to protect drivers 112 when the portable speakers 100 are not in use and in the first configuration.

The hinge 122 may be any suitable form of hinge or hinges including a spring hinge to bias the first enclosure to the second or open configuration, piano hinge, or the like. The hinge 122 may also act as a switch such that moving the first enclosure 114 away from the second enclosure 214 from the first configuration towards the second configuration may turn on the speakers 100.

All electrical connections between the first enclosure 114 and the second enclosure 124 may be by a cable (not shown) that may pass through hinge 122. The cable may be of any suitable form including co-axial, flat, or the like.

In this way not only are the drivers 112 protected when not in use, but all electronic components, source for power such as batteries, controls 146, and the like, are physically and acoustically separated from the drivers 112 to thus reduce induced vibration and thus distortion, and unwanted microphonic effects.

A mechanical stop may be provided to prevent first enclosure 114 pivoting excessively relative to second enclosure 124. Preferably, when in the second or open configuration of FIG. 2, the first surface is at an included angle relative to the upper surface that is in the range 90° to 120°. When in the open or second configuration, the centre of gravity of the first compartment may be outside the periphery of the second compartment so that it will not tend to close when the speaker 100 is in use. When in the configuration of FIG. 2, the second enclosure 124 also acts as a stable base for the first enclosure 114 with the enclosed electronics and batteries providing, at least in part, the necessary weight to lower the position of the centre of gravity and, correspondingly, improve the stability of the speakers 100.

If desired or required, a dampening material such as, for example, rubber, may be placed between hinge 122 and first enclosure 114 and/or second enclosure 124.

Figure 3:
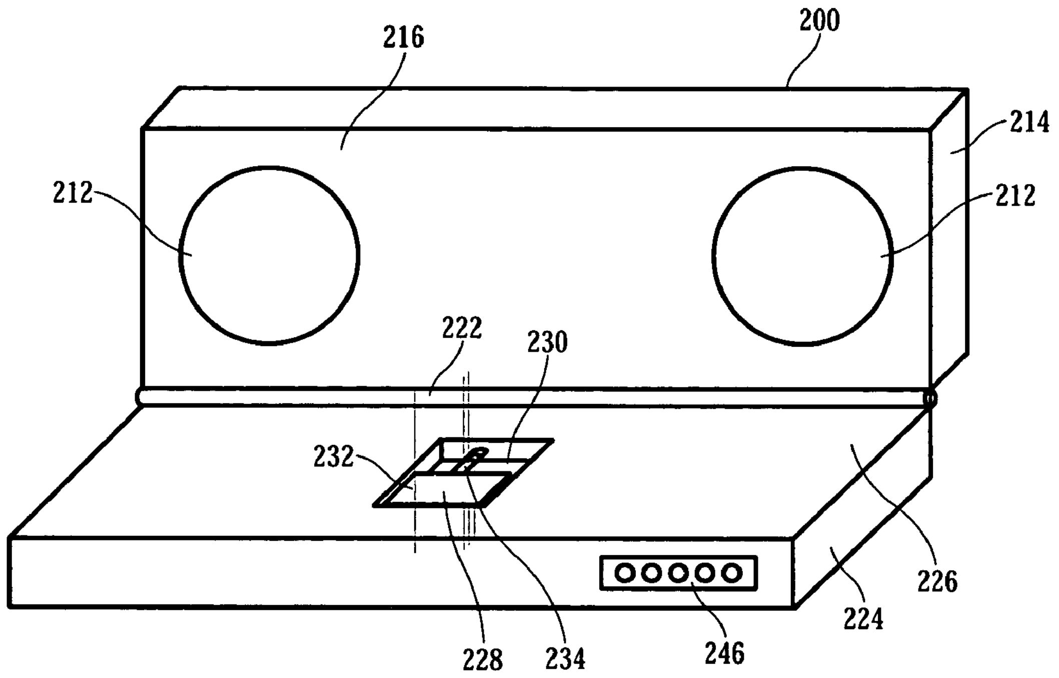
FIG. 3 is a front perspective view of a second embodiment in a first configuration.
Figure 4:
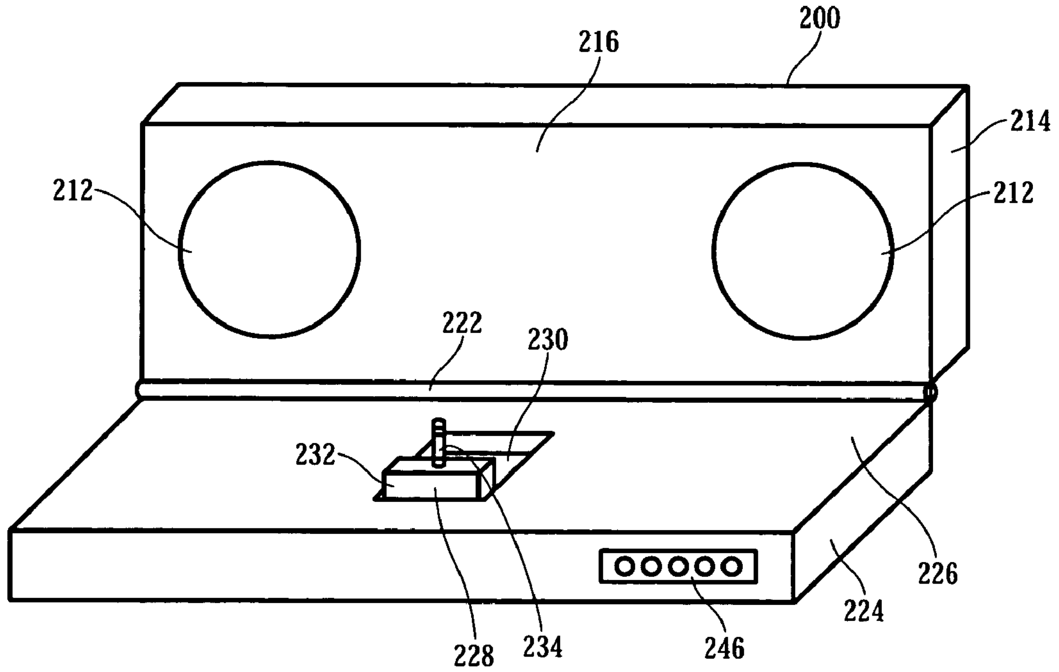
FIG. 4 is a view corresponding to FIG. 2 in a second configuration.

The second embodiment of FIGS. 3 and 4 is for a portable speaker 200 and is substantially the same as the first embodiment 100. The principal difference is the addition of a pivoting connector 228. The mounting of the connector 228 is in recess 230 and is relative to upper surface 226 is such that when connector 228 is in the first (non-use) configuration of FIG. 3, its top surface 232 is flush with or below upper surface 226. When the connector 228 is in the second or in-use configuration of FIG. 4, a jack 234 that forms part of pivoting connector 228 extends upwardly from upper surface 226. The jack 234 is preferably a headphone jack (as illustrated) to enable it to directly engage a headphone port in an audio player/module, or other form of media player, (not shown). Instead of the jack 234, a port or a receptor may be incorporated into connector 228 for the connection of the audio player/module.

The pivoting connector 228 and its recess 230 are located in upper surface 226 between the drivers 212 such that if the first enclosure 21 is mounted to the first (closed) configuration, the pivoting connector 228 will not damage the drivers 212.

Figure 5:
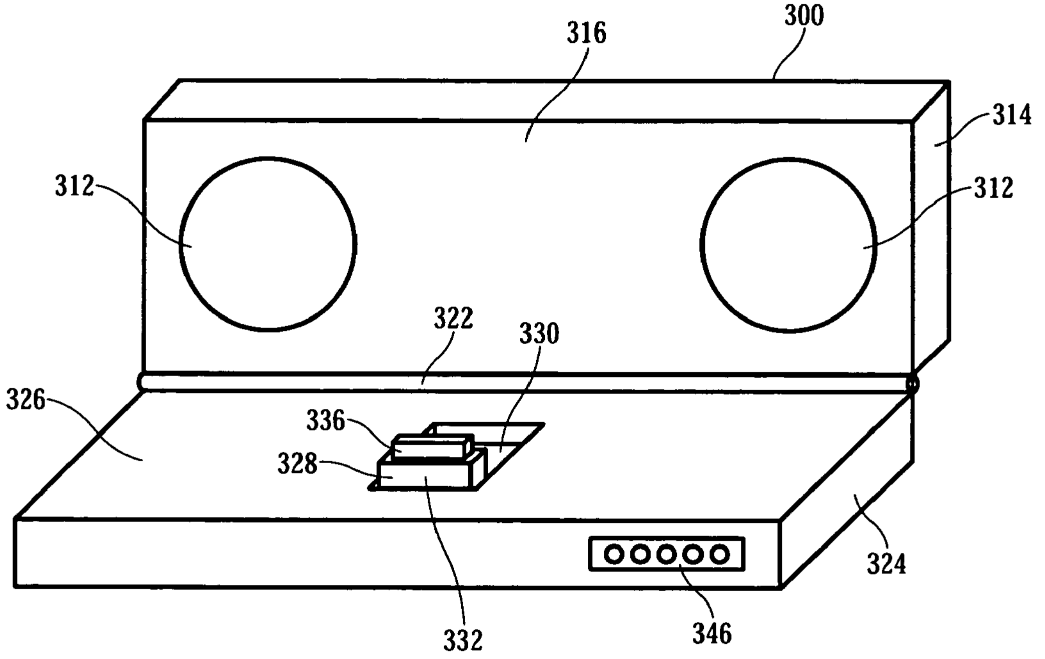
FIG. 5 is a front perspective view of a third embodiment in a first configuration.
Figure 6:
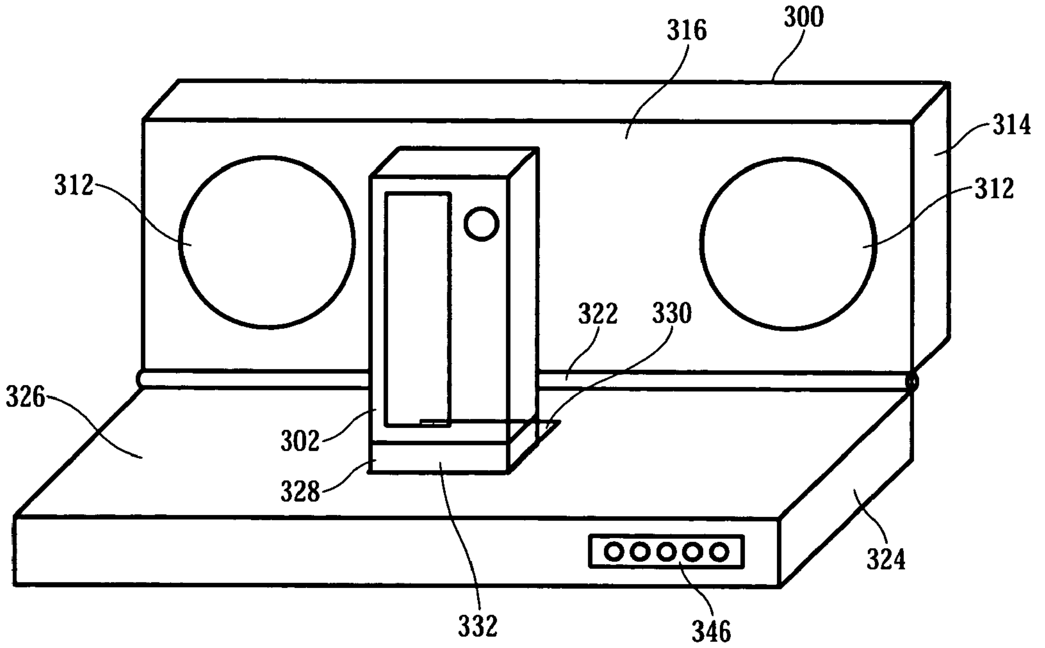
FIG. 6 is a view corresponding to FIG. 5 with an audio player operatively attached.
Figure 7:
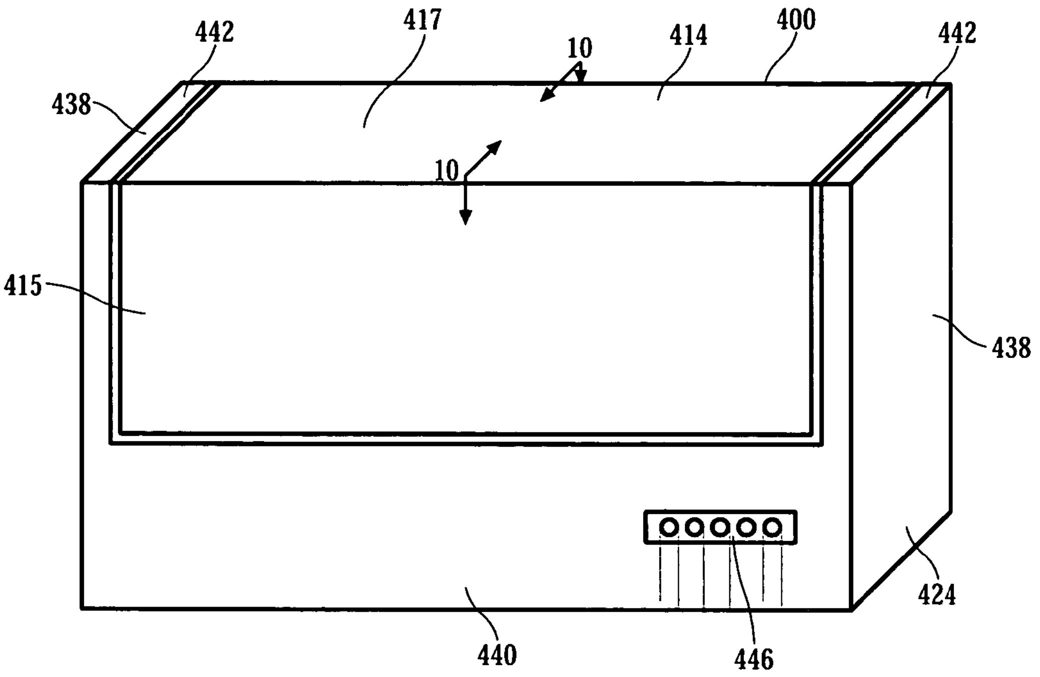
FIG. 7 is a front perspective view of a fourth embodiment in a first configuration.

The portable speakers 300 of the third embodiment of FIGS. 5 and 6 are substantially the same as the second embodiment 200 except that jack 234 is replaced by a multiple-pin connection 336 such as, for example, a USB, IEEE1394, or custom multiple-pin connection. As shown in FIG. 6, like the second embodiment, an audio player 302 can be directly mounted to connection 336 both physically and electrically.

The portable speakers 400 of the fourth embodiment are shown in FIGS. 7 to 10. Here, the first enclosure 414 is pivotally mounted to and within second enclosure 424 by means of pivot pins 418 extending outwardly from the ends 420 of first enclosure 414, the pivot pins 418 engaging extended side walls 438 of second enclosure 424. Alternatively, the pivot pins 418 may extend inwardly from side walls 438 and engage ends 420 of first enclosure 414.

When in the first or non-use configuration (FIGS. 7 and 10), the two exposed side surfaces 415, and 417 of first enclosure 414 are substantially flush or co-planar with their corresponding surfaces 440, and 442 of second enclosure 424.

When in the second or in-use configuration (FIGS. 8 and 9), the two exposed side surfaces 416 and 415 of first enclosure 414 are substantially flush or co-planar with their corresponding surfaces 440, and 442 of second enclosure 424.

Figure 8:
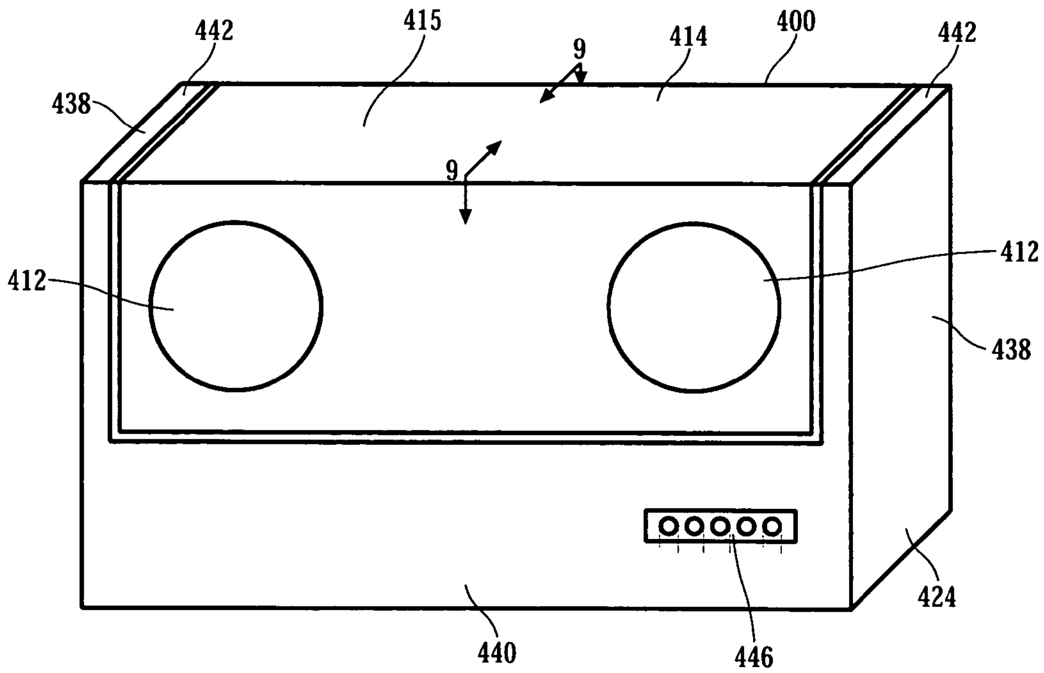
FIG. 8 is a view corresponding to FIG. 7 in a second configuration.
Figure 9:
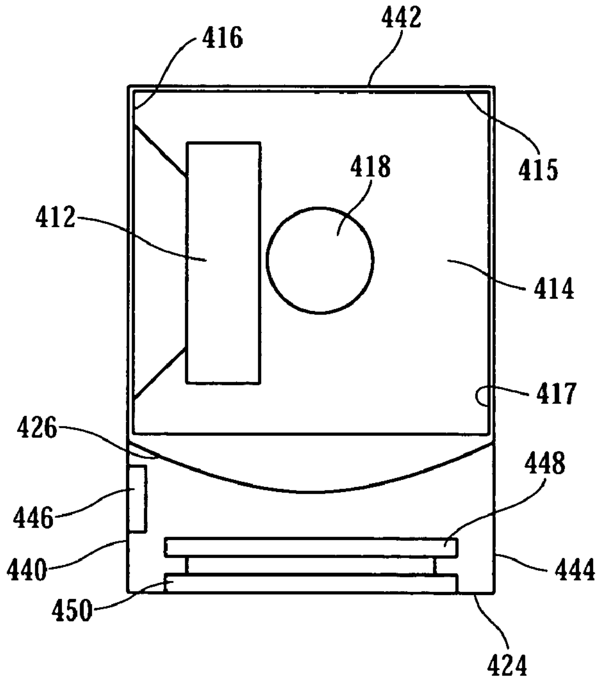
FIG. 9 is a vertical cross-section along the lines and in the direction of arrows 9-9 in FIG. 8.
Figure 10:
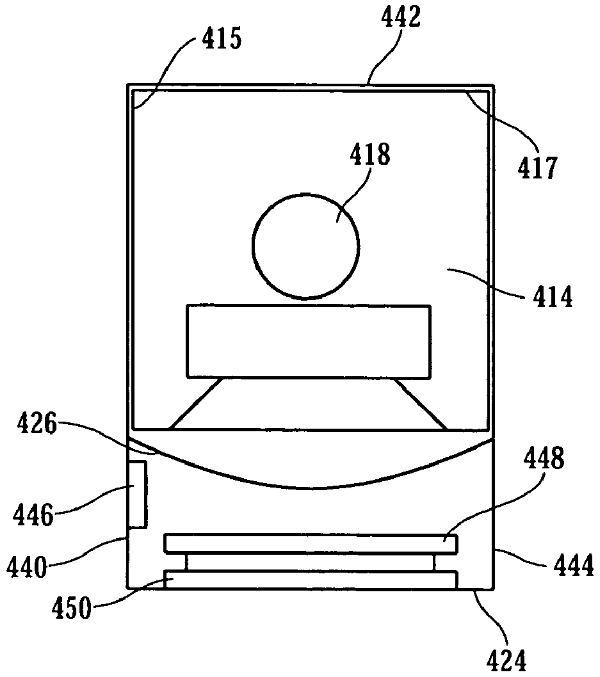
FIG. 10 is a vertical cross-section along the lines and in the direction of arrows 10-10 in FIG. 7.

As can be seen from FIGS. 8 and 9, when in the use or second configuration, drivers 412 face outwardly. They may face upwardly, or at an incline, if desired or required.

The upper surface 426 of second enclosure is concave along its length to allow for the pivoting movement of the first enclosure 414. Preferably, electrical connections to drivers 412 from the second enclosure 424 are through cables passing through one or both pivot pins 418.

Again, the drivers 412 are protected when in the first, or non-use configuration, and a pivoting movement of 90 degrees is required to move the drivers 412 to a second or in-use position. The electronics 448, battery compartment 450 and controls 446 are located in the second enclosure and the drivers 412 are in the first enclosure, again to reduce microphonics, and the second enclosure 424 acts as a stable base for the first enclosure 414.

Figure 11:
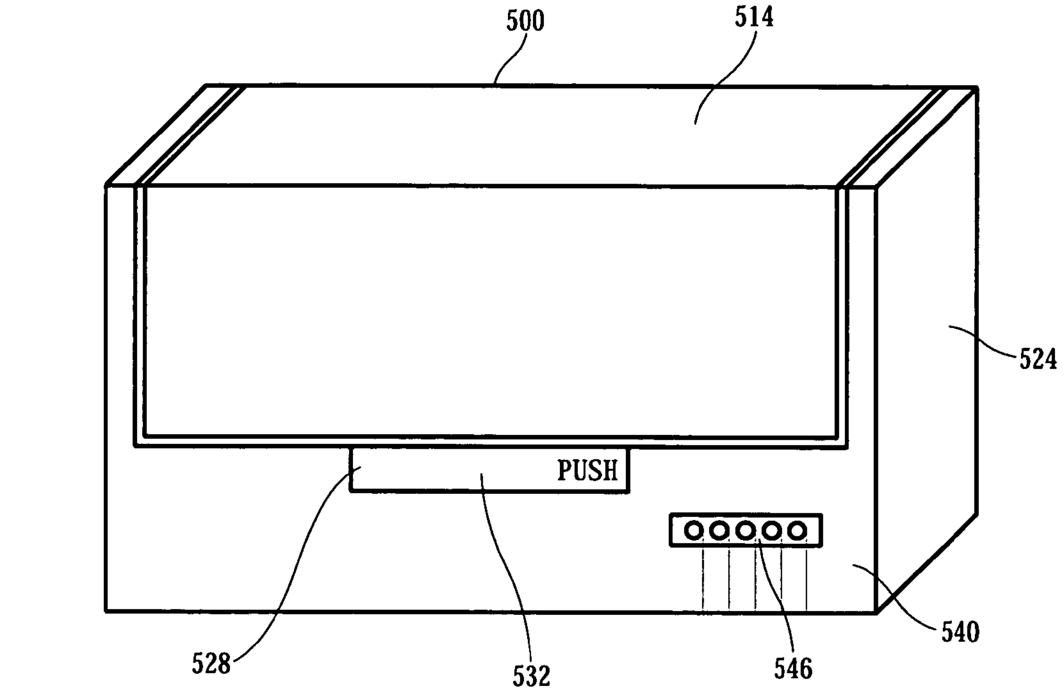
FIG. 11 is a view corresponding to FIG. 7 of a fifth embodiment.
Figure 12:
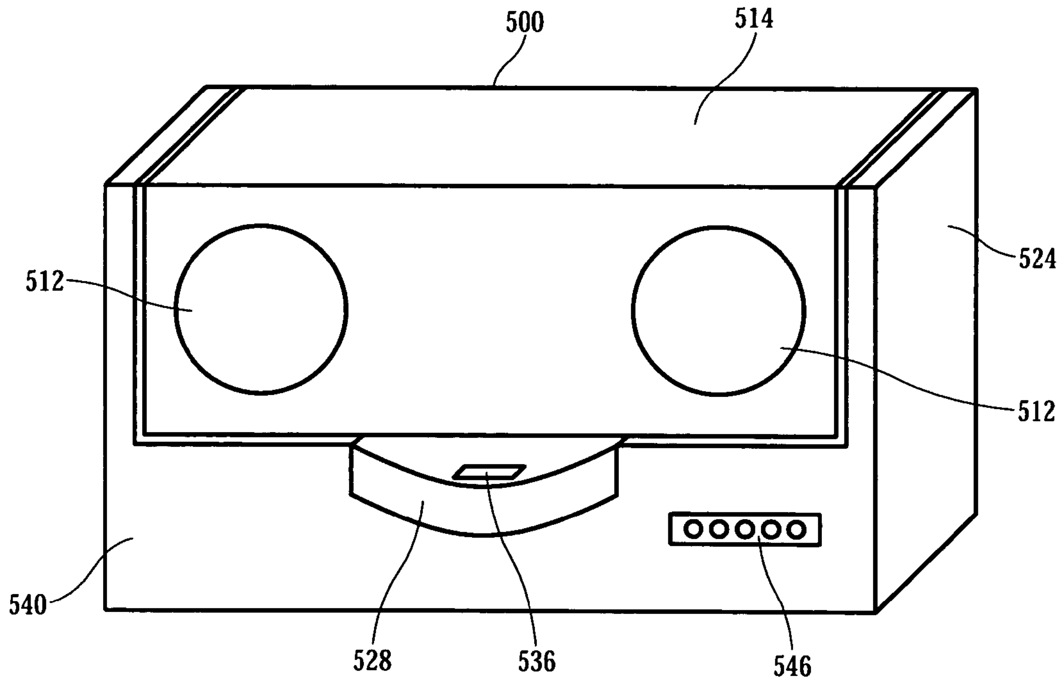
FIG. 12 is a view corresponding to FIG. 8 of the fifth embodiment.
Figure 13:
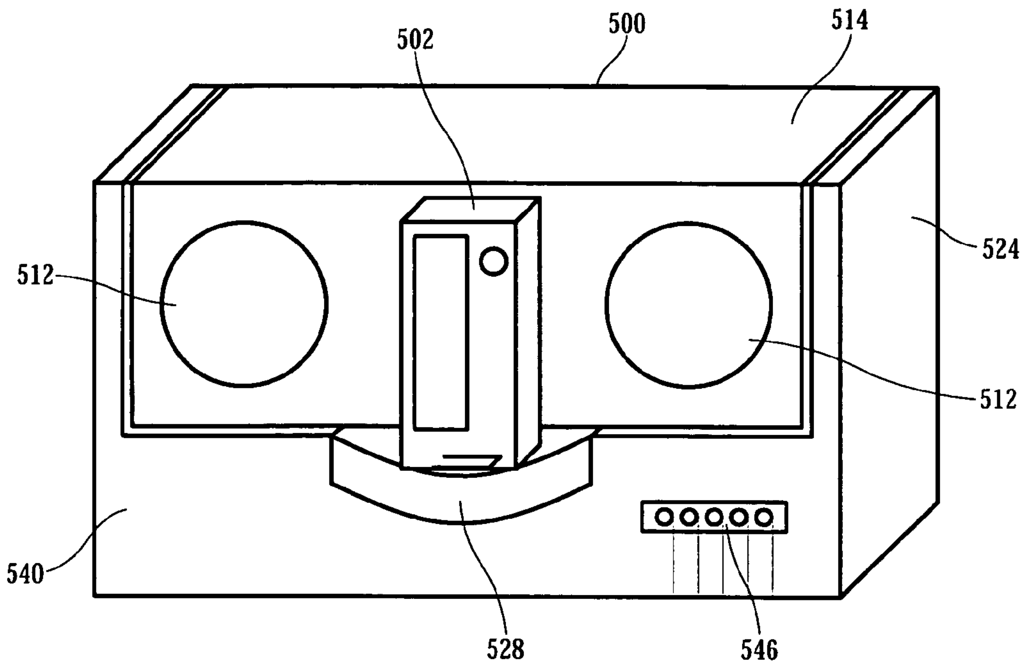
FIG. 13 is a view corresponding to FIG. 12 with an audio player attached.

The fifth embodiment of portable speakers 500 of FIGS. 11 to 13 is substantially the same as the fourth embodiment 400 with the principal difference being the addition of a pivoting connector 528 in front surface 540 of second enclosure 524. The connector 528 pivots about one or more vertical pivot pins (not shown) between a first or non-use position of FIG. 11 to a second or in-use position of FIGS. 12 and 13.

The connector 528 includes a connection 536 that may be a USB, IEEE1394, or custom multiple-pin connection (as shown), jack, or the like. The connection 536 is to enable a direct physical and electrical connection by the audio player, or other media player 502, (FIG. 13). When in the non-use position, end 532 of connector 528 is flush with front surface 540.

Figure 14:
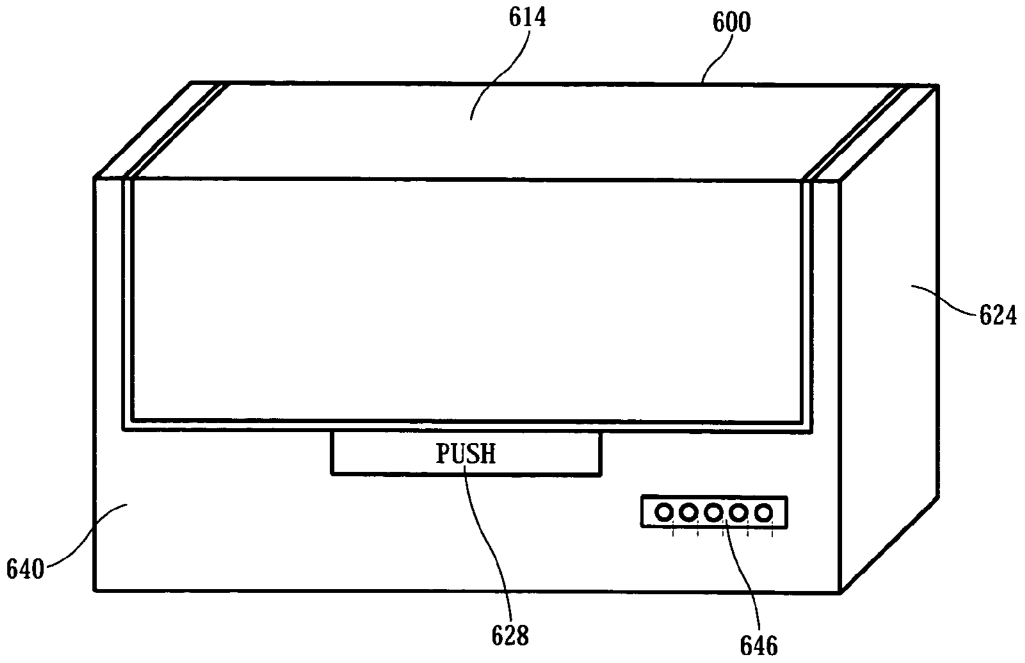
FIG. 14 is a view corresponding to FIG. 7 of a sixth embodiment.
Figure 15:
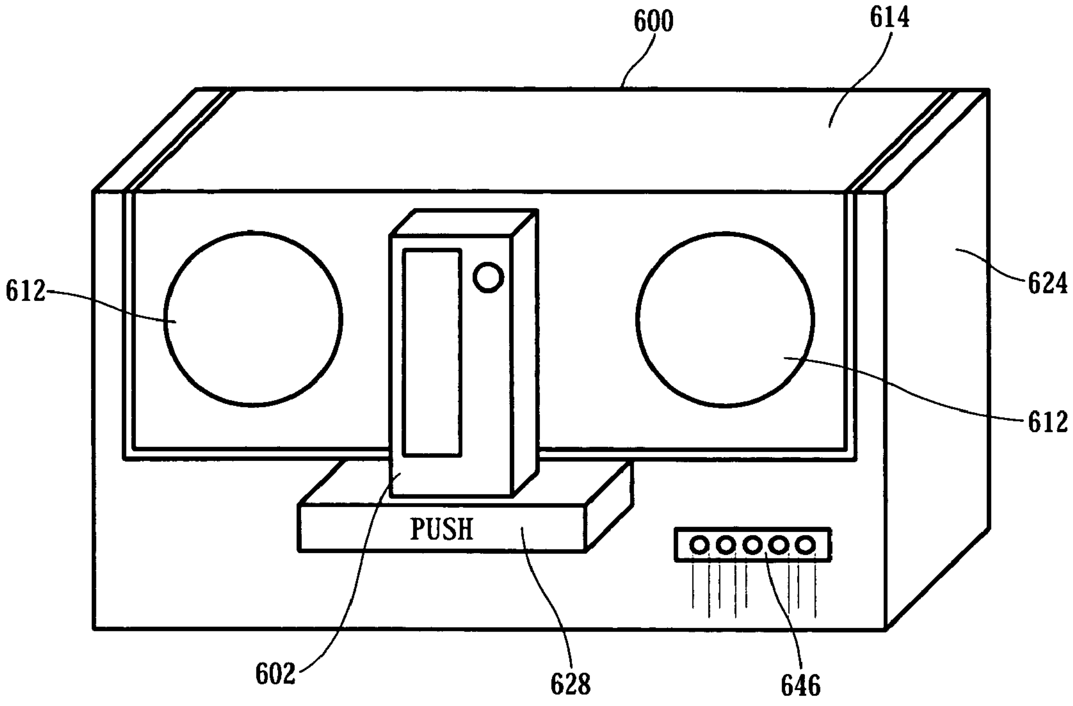
FIG. 15 is a view corresponding to FIG. 8 of the sixth embodiment.

The sixth embodiment of portable speakers 600 of FIGS. 14 and 15 is the same as the of the fifth embodiment 500 except that the connector 628 has a sliding mounting in and relative to front surface 640. Preferably, it is a "push-to-engage, push-to-release" mounting.

Whilst there has been described in the foregoing description preferred embodiments of the present invention, it will be understood by those skilled in the technology concerned that many variations or modifications in details of design or construction may be made without departing from the present invention.

The invention claimed is:

1. A portable speaker comprising:

(a) at least one driver mounted in a first enclosure having a first surface in which the at least one driver is mounted; and (b) a second enclosure having an upper surface, the second enclosure being configurable to carry electronic components associable with the portable speaker and being pivotally mounted to the first enclosure, the second enclosure having a recess in which a connector movable to a first position and a second position can be accommodated, the connector being usable for one of connection to an audio player and engaging an audio output port of the audio player, wherein the connector is movable to the second position when in use for one of connection to the audio player and engaging the audio output port of the audio player, and movable to the first position otherwise, wherein the first enclosure is pivotally moveable relative to the second enclosure such that the portable speaker is in one of a first configuration and a second configuration, and wherein when in the first configuration, the first surface overlays the upper surface for protecting the at least one driver and when in the second configuration, the first surface is moved away from the upper surface such that the at least one driver is acoustically separable from the electronic components associable with the portable speaker.

2. A portable speaker as claimed in claim 1, wherein the pivotal movement is about a pivotal connection between the first surface and the upper surface.

3. A portable speaker as claimed in claim 1, wherein the pivotal movement is about at least one pivot pin operatively connecting ends of the first enclosure with extended sides of the second enclosure.

4. A portable speaker as claimed in claim 3, wherein the upper surface is concave along its length.

5. A portable speaker as claimed in claim 1, wherein the electronic components associable with the portable speaker includes controls for the portable speaker and a source for power, and wherein the source for power is selected from the group consisting of batteries, mains supply and capacitors.

6. A portable speaker as claimed in claim 1, wherein the at least one driver is acoustically separable from the electronic components associable with the portable speaker, such that induced vibration, distortion and unwanted microphonic effects are reduced in the electronic components associable with the portable speaker.

7. A portable speaker as claimed in claim 1, wherein when in the first configuration, the portable speaker is not in use.

8. A portable speaker comprising:

(a) at least one driver mounted in a first enclosure;

(b) a second enclosure separate from and having pivotally mounted to it the first enclosure, wherein the first enclosure has a first surface in which the at least one driver is mounted and the second enclosure has an upper surface, the first enclosure being pivotally moveable relative to second enclosure such that the first surface overlays the upper surface for protecting the at least one driver when the portable speaker is not in use; and (c) a connector operatively connected to the second enclosure for movement relative thereto between a first position and a second position, the connector having a connection for operative connection with a player when the connector is in the second position.

9. A portable speaker as claimed in claim 8, wherein the movement of the connector is selected from the group consisting of pivoting and sliding.

10. A portable speaker as claimed in claim 8, wherein the connector has surface that is substantially flush with a front surface of the second enclosure when the connector is in the first position.

11. A portable speaker comprising:

(a) at least one driver mounted in a first enclosure;

(b) a second enclosure separate from and having pivotally mounted to it the first enclosure; the second enclosure comprising all electronics, controls and a source for power; the first enclosure comprising a first surface in which the at least one driver is mounted and the second enclosure has an upper surface, the first enclosure being pivotally moveable relative to second enclosure such that the first surface overlays the upper surface for protecting the at least one driver when the portable speaker is not in use; and (c) a connector operatively connected to the second enclosure for movement relative thereto between a first, position and a second position, the connector having a connection for operative connection with a player when the connector is in the second position.

12. A portable speaker as claimed in claim 11, wherein the movement of the connector is selected from the group consisting of pivoting and sliding.

13. A portable speaker as claimed in claim 11, wherein the connector has surface that is substantially flush with a front surface of the second enclosure when the connector is in the first position.

14. A portable speaker as claimed in claim 8, wherein the connector is selected from the group consisting of USB, IEEE1394, custom multiple-pin connection, and jack.

15. A portable speaker as claimed in claim 8, wherein the connector is selected from the group consisting of USB, IEEE1394, custom multiple-pin connection, and jack.

* * * * *